(12) United States Patent
Byeon

(10) Patent No.: US 7,733,132 B2
(45) Date of Patent: Jun. 8, 2010

(54) BULK BIAS VOLTAGE LEVEL DETECTOR IN SEMICONDUCTOR MEMORY DEVICE

(75) Inventor: Sang-Jin Byeon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/082,066

(22) Filed: Apr. 7, 2008

(65) Prior Publication Data

US 2008/0212390 A1 Sep. 4, 2008

Related U.S. Application Data

(62) Division of application No. 11/323,632, filed on Dec. 29, 2005, now Pat. No. 7,366,048.

(30) Foreign Application Priority Data

Jun. 30, 2005 (KR) ............... 10-2005-0058450

(51) Int. Cl.
  *H03K 5/153* (2006.01)
(52) U.S. Cl. ............... 327/77; 327/78; 327/80
(58) Field of Classification Search .......... 327/77, 327/78, 80, 143, 333, 534, 537; 326/68, 326/81

See application file for complete search history.

(56) References Cited

U.S. PATENT DOCUMENTS

| | | | |
|---|---|---|---|
| 4,794,278 A * | 12/1988 | Vajdic | 327/537 |
| 5,077,671 A * | 12/1991 | Leslie et al. | 701/3 |
| 5,243,228 A | 9/1993 | Maruyama et al. | |
| 5,392,205 A * | 2/1995 | Zavaleta | 363/59 |
| 5,506,540 A * | 4/1996 | Sakurai et al. | 327/535 |
| 5,668,487 A * | 9/1997 | Chonan | 327/80 |
| 5,673,232 A * | 9/1997 | Furutani | 365/226 |
| 5,721,704 A * | 2/1998 | Morton | 365/185.23 |
| 5,736,869 A * | 4/1998 | Wei | 326/81 |
| 5,740,102 A * | 4/1998 | Kawashima | 365/154 |
| 5,760,614 A * | 6/1998 | Ooishi et al. | 327/77 |
| 5,818,290 A * | 10/1998 | Tsukada | 327/537 |
| 5,838,189 A * | 11/1998 | Jeon | 327/537 |
| 5,886,567 A * | 3/1999 | Park et al. | 327/537 |
| 5,920,226 A * | 7/1999 | Mimura | 327/537 |

(Continued)

FOREIGN PATENT DOCUMENTS

JP 6-28853 2/1994

(Continued)

*Primary Examiner*—Long Nguyen
(74) *Attorney, Agent, or Firm*—Blakely, Sokoloff, Taylor & Zafman LLP

(57) ABSTRACT

There is provided a bulk bias voltage VBB level detector in a semiconductor memory device capable of improving tWR fail generated at a low temperature by compensating a temperature variance. The VBB level detector includes A bulk bias voltage level detector in a semiconductor memory device, comprising: a voltage divider for generating detection voltage based on an inputted bulk voltage; and a CMOS circuit for generating a output signal having predetermined logic value determined by the detection voltage wherein the voltage divider includes a first transistor having a gate coupled to a ground voltage and a second transistor having a gate coupled to an internal power voltage and a bulk coupled to the inputted bulk voltage.

4 Claims, 4 Drawing Sheets

U.S. PATENT DOCUMENTS

| | | | |
|---|---|---|---|
| 6,060,930 A * | 5/2000 | Choi | 327/276 |
| 6,064,250 A * | 5/2000 | Proebsting | 327/536 |
| 6,074,899 A * | 6/2000 | Voldman | 438/155 |
| 6,169,426 B1 | 1/2001 | Lee et al. | |
| 6,172,554 B1 * | 1/2001 | Young et al. | 327/537 |
| 6,259,310 B1 | 7/2001 | Kawamura | |
| 6,404,221 B1 * | 6/2002 | Kawakubo et al. | 327/537 |
| 6,404,258 B2 * | 6/2002 | Ooishi | 327/278 |
| 6,492,850 B2 * | 12/2002 | Kato et al. | 327/143 |
| 6,624,685 B2 * | 9/2003 | Shih et al. | 327/541 |
| 6,661,253 B1 * | 12/2003 | Lee et al. | 326/41 |
| 6,870,410 B1 * | 3/2005 | Doyle et al. | 327/149 |
| 6,882,215 B1 * | 4/2005 | Lee | 327/536 |
| 6,970,024 B1 * | 11/2005 | Reese et al. | 327/112 |
| 7,005,908 B2 * | 2/2006 | Lee et al. | 327/333 |
| 7,366,048 B2 * | 4/2008 | Byeon | 365/226 |
| 2004/0140842 A1 * | 7/2004 | Lee et al. | 327/333 |

FOREIGN PATENT DOCUMENTS

| | | |
|---|---|---|
| JP | 00199244 | 7/1998 |
| JP | 00313078 | 10/2002 |
| KR | 1998-034255 | 8/1998 |
| KR | 2002-0069279 | 8/2002 |

* cited by examiner

BULK BIAS VOLTAGE LEVEL DETECTOR IN SEMICONDUCTOR MEMORY DEVICE

The present patent application is a Divisional of application Ser. No. 11/323,632, filed Dec. 29, 2005, now U.S. Pat. No. 7,366,048.

FIELD OF THE INVENTION

The present invention relates to a circuit for generating an internal voltage of a semiconductor memory device; and more particularly, to a circuit for detecting a level of a bulk bias voltage VBB in a circuit for generating a bulk bias voltage VBB.

DESCRIPTION OF RELATED ART

Most of semiconductor memory chips include a circuitry for an internal voltage in order to generate internal voltages of various levels by using an external voltage such as a power voltage VCC, a ground voltage VSS or the like, supplied from an exterior. A voltage needed for driving the circuitry for generating the internal voltage in the chip is supplied by itself. In designing the circuitry for generating the internal voltage, a main issue is to stably apply the internal voltage having a desired level.

Meanwhile, in order to generate the internal voltage having a predetermined voltage level ranging out of a swing level of the external power voltage in the circuit for generating the internal voltage, it is needed for boosting up a voltage level by using a charge pumping circuit. Such a voltage generated through a charge-pumping mode is mainly classified into a boosted voltage VPP and a bulk bias voltage VBB. In a DRAM, for example, the boosted voltage VPP has a predetermined voltage level higher than that of the power voltage VCC and it is mainly used as a driving voltage for a word line. The bulk bias voltage VBB has a negative voltage level lower than that of the ground voltage VSS and it is supplied to a channel, e.g., a predetermined well incorporating therein the channel in substance, for the purpose of increasing a data retention time by increasing a threshold voltage Vth of a cell transistor, i.e., an NMOS transistor. Herein, the bulk bias voltage VBB is often called a back bias voltage.

FIG. 1 is a block diagram setting forth a conventional circuit for generating a bulk bias voltage VBB.

Referring to FIG. 1, the conventional circuit for generating the bulk bias voltage VBB includes a bulk bias voltage VBB level detector 10 (hereinafter, referred to as VBB level detector) for detecting a level state of a fed back bulk bias voltage VBB, a ring oscillator 20 for performing an oscillation operation in response to an oscillation enable signal bbeb of the VBB level detector 10, a pump control logic 30 for receiving an oscillation signal osc of the ring oscillator 20 so as to generate pumping control signals PS1, PS2, G1 and G2, a doubler charge pump 40 for performing a charge pumping operation according to the pumping control signals PS1, PS2, G1 and G2 so as to output the bulk bias voltage VBB.

FIG. 2 is a circuit diagram illustrating the VBB level detector 10 in the conventional circuit for generating the bulk bias voltage of FIG. 1.

Referring to FIG. 2, the VBB level detector 10 in the conventional circuit for generating the bulk bias voltage includes a voltage divider 2 for outputting a detection voltage DET varied in analog according to a level of the fed back bulk bias voltage VBB, a CMOS inverter 4 for outputting the detection voltage DET as a predetermined logic value according to a logic threshold value, and a level shifter 6 for increasing a swing width of the output signal of the CNOS inverter 4.

Herein, the voltage divider 2 is provided with a PMOS transistor P1 acting as a resistor (hereinafter, referred to as a first PMOS resistor P1) and a PMOS transistor P2 acting as a resistor also (hereinafter, referred to as a second PMOS resistor P2). A source and a drain of the first PMOS resistor P1 are connected to a core voltage VCORE and the detection voltage DET, respectively, wherein a ground voltage VSS is supplied to a gate thereof. In addition, a source and a drain of the second PMOS resistor P2 are connected to the detection voltage DET and the ground voltage VSS, respectively, wherein the bulk bias voltage VBB is supplied to a gate thereof. Meanwhile, the core voltage VCORE is supplied to each bulk bias voltage of the first and the second PMOS resistors P1 and P2.

Furthermore, the CMOS inverter 4 is provided with a pull-up PMOS transistor P3 and a pull-down NMOS transistor N1, which are connected between the core voltage VCORE and the ground voltage VSS, wherein the detection voltage DET is supplied to each gate thereof.

The level shifter 6 is provided with a first inverter INV1 receiving the output signal of the CMOS inverter 4 whose swing width ranges from the ground voltage VSS to the core voltage VCORE, a second NMOS transistor N2, a third NMOS transistor N3, a fourth PMOS transistor P4, a fifth PMOS transistor P5, and a second inverter INV2 connected to an output node for outputting an oscillation enable signal bbeb of which swing width ranges from the ground voltage VSS to the core voltage VCORE. Herein, a source of the second NMOS transistor N2 is connected to the ground voltage VSS in which the output signal of the CMOS inverter 4 is supplied to a gate thereof, and a source of the third NMOS transistor N3 is connected to the ground voltage VSS in which the output signal of the inverter INV1 is supplied to a gate thereof. In addition, a source and a drain of the fourth PMOS transistor P4 are connected to the power voltage VCC and the drain, i.e., the output node, of the second NMOS transistor N2, in which a gate of the fourth PMOS transistor P4 is connected to the drain of the third NMOS transistor N3. Likewise, a source and a drain of the fifth PMOS transistor P5 are connected to the power voltage VCC and the drain, i.e., the output node, of the third NMOS transistor N3, in which a gate of the fifth PMOS transistor P5 is connected to the drain of the NMOS transistor N2. The level shifter 6 shown in the drawing is configured with an exemplary constitution for converting a signal of which the swing width ranges from the ground voltage VSS to the core voltage VCORE, into a predetermined signal of which the swing width ranges from the ground voltage VSS to the power voltage VCC.

Meanwhile, since the constitutions and the operations for the ring oscillator 20, the pump control logic 30 and the doubler charge pump 40 have been well known and further, these elements are not directly concerned with the present invention, detail descriptions for these elements will be omitted herein.

Referring back to FIG. 2, an operational mechanism of the VBB level detector 10 according to the conventional circuit will be set forth.

As described above, the voltage divider 2 determines the voltage level of the detection voltage DET by a difference between effective resistances of the first and the second PMOS resistors P1 and P2. At this time, assumed that the effective resistance of the first PMOS resistor P1 may be uniform because the ground voltage VSS is supplied to the gate thereof, it makes no difference that the level of the detection voltage DET is determined by the second PMOS resistor P2 where the bulk bias voltage VBB is supplied to the gate.

For instance, if the level of the fed back bulk bias voltage VBB becomes increased in comparison with a target level, i.e., if an absolute value of the bulk bias voltage VBB level becomes lowered, the effective resistance of the second PMOS resistor P2 becomes increased. Accordingly, the detection voltage DET has a predetermined voltage level higher than a switching point, e.g., VCORE/2 in general, of the CMOS inverter 4 so that the output signal of the CMOS inverter 4 becomes in logic low level.

Meanwhile, provided that the output signal of the CMOS inverter 4 becomes in logic low level, the output node of the level shifter 6 becomes in logic high level to activate an oscillation enable signal bbeb to be in logic low level at last.

In case that the oscillation enable signal bbeb is activated, the ring oscillator 20 is enabled so as to output the oscillation signal osc having a predetermined period. As a result, the doubler charge pump 40 performs a charge pumping operation under being controlled by the pump control logic 30 so as to lower the VBB level. That is, the absolute value of the VBB level becomes increased.

Meanwhile, if the VBB level is getting lowered so as to reach to the target level, the effective resistance of the second PMOS resistor P2 becomes decreased so that the level of the detection voltage DET becomes lowered. Accordingly, the output signal of the CMOS inverter 4 becomes in logic high level and inactivates the oscillation enable signal to be in logic high level, to thereby stop the charge pumping operation.

However, the VBB level detector 10 according to the prior art shows a characteristic that the absolute value of the VBB detection level is almost uniform or decreased a little according as the temperature increases, which is illustrated in FIG. 4.

This phenomenon is caused by that a threshold voltage variance versus a temperature variance of the first and the second PMOS resistors P1 and P2, which means a variance of the effective resistance, i.e., temperature coefficients, are different from each other. In detail, whereas a voltage Vbs between the source and a bulk in the first PMOS resistor P1 is 0 V, a voltage Vbs between the source and a bulk in the second PMOS resistor P2 is varied with the absolute value of the bulk bias voltage VBB. That is, even though the size of the first PMOS resistor P1 is identical to that of the second one P2, the threshold voltage for each transistor may be changed according to various conditions that the bias voltage is supplied to the first and the second PMOS resistors P1 and P2. In addition, the variance of the effective resistance versus the temperature variance may be changed in an operational range. In other words, since the decrement of the effective resistance of the second PMOS resistor P2 becomes larger than that of the first PMOS resistor P1, the charge pumping operation is stopped although the absolute value of the bulk bias voltage VBB, i.e., the gate voltage of the second PMOS resistor P2, is less than the gate voltage VSS of the first PMOS resistor P1. For instance, in case of the level of the detection voltage DET while the absolute value of the bulk bias voltage VBB is fixed to a predetermined value, the level of the detection voltage DET becomes lowered. Vice versa, as the temperature is increased, the absolute value of the bulk bias voltage VBB should be decreased in order that the charge pumping operation may be stopped. Therefore, the conventional VBB level detector 10 shows that the absolute value of the VBB detection level is somewhat increased as the temperature is decreased.

As described above, the bulk bias voltage VBB is used for increasing a data retention time by increasing the threshold voltage of the cell transistor. However, in case that the threshold voltage of the cell transistor becomes increased, much time is needed for charging desired amount of charges at the cell because it is necessary for overcoming the high threshold voltage in order to record the data at the cell during a write operation. This phenomenon is more serious when the temperature is getting lowered because the threshold voltage of the cell transistor becomes more increased as the temperature becomes lowered.

But, since the conventional VBB level detector 10 has a characteristic that the absolute value of the VBB detection level is almost uniform or decreased as the temperature becomes lowered, which incurs to increase the threshold voltage of the cell transistor. At last, this causes a time to write recovery (tWR) fail in the semiconductor device.

SUMMARY OF THE INVENTION

It is, therefore, an object of the present invention to provide a bulk bias voltage level detector in a semiconductor memory device capable of improving a time to write recovery (tWR) fail generated at a low temperature by compensating a temperature variance.

In accordance with an aspect of the present invention, there is provided a bulk bias voltage level detector in a semiconductor memory device, including: a voltage divider for generating detection voltage based on an inputted bulk voltage; and a CMOS circuit for generating a output signal having predetermined logic value determined by the detection voltage wherein the voltage divider includes a first transistor having a gate coupled to a ground voltage and a second transistor having a gate coupled to an internal power voltage and a bulk coupled to the inputted bulk voltage.

In accordance with another aspect of the present invention, there is provided a bulk bias voltage level detector in a semiconductor memory device, including: a voltage divider for generating detection voltage based on an inputted bulk voltage; and a CMOS circuit for generating a output signal having predetermined logic value determined by the detection voltage, wherein the voltage divider includes a transistor having a gate coupled to a ground voltage and a passive resistor coupled to the inputted bulk voltage.

In viewpoint of the bulk bias voltage VBB level detector, why the tWR fail is generated at the low temperature is that the VBB level detector has a poor capability of temperature compensation. Therefore, in order to overcome this problem, it is needed for designing the VBB level detector such that its detection level may be changed according to the temperature variance. That is, if the VBB level detector is configured such that an absolute value of the VBB detection level becomes high at a high temperature and the absolute value of the VBB detection level becomes low at a low temperature, it is possible to reduce a threshold voltage of the cell transistor at the low temperature. To this end, there is employed an NMOS resistor or a passive resistor as an effective resistor of a bulk bias voltage terminal in a voltage divider.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 3:
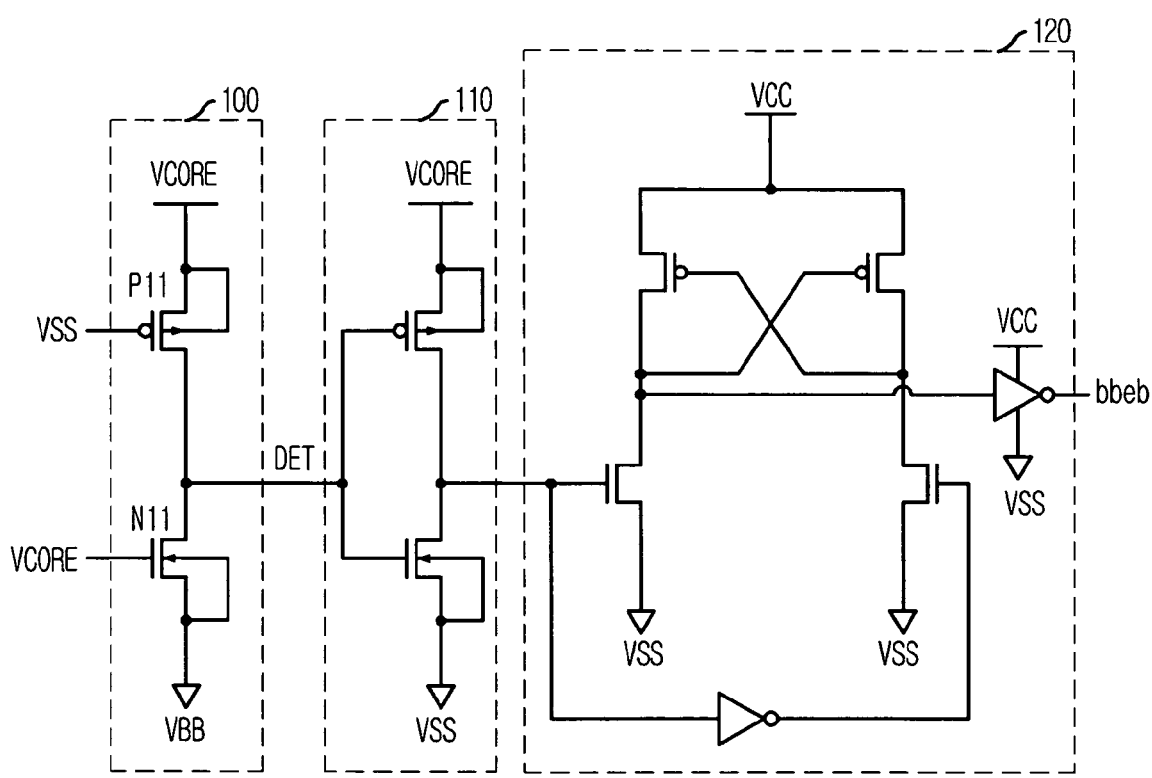
FIG. 3 is a circuit diagram of a VBB level detector in accordance with one embodiment of the present invention.

FIG. 3 is a circuit diagram of a bulk bias voltage VBB level detector in accordance with one embodiment of the present invention.

Referring to FIG. 3, the VBB level detector of the present invention includes a voltage divider 100 for outputting a detection voltage DET varied in analog according to a level of a fed back bulk bias voltage VBB, a CMOS inverter 110 for outputting the detection voltage DET as a predetermined logic value according to a logic threshold voltage, and a level shifter 120 for increasing a swing width of the output signal of the CMOS inverter 110.

Figure 1:
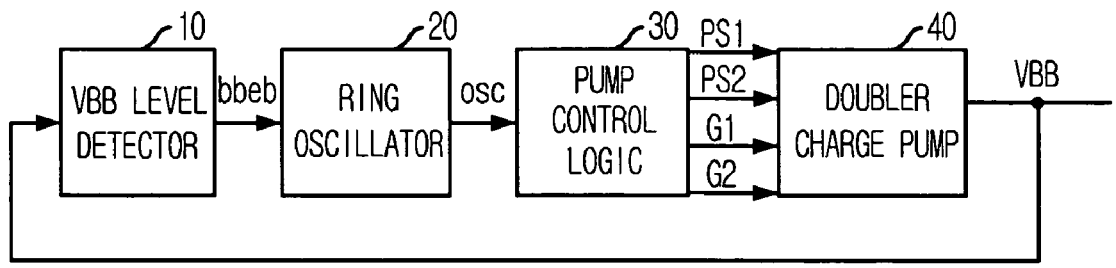
FIG. 1 is a block diagram setting forth a conventional circuit for generating a bilk bias voltage VBB.
Figure 2:
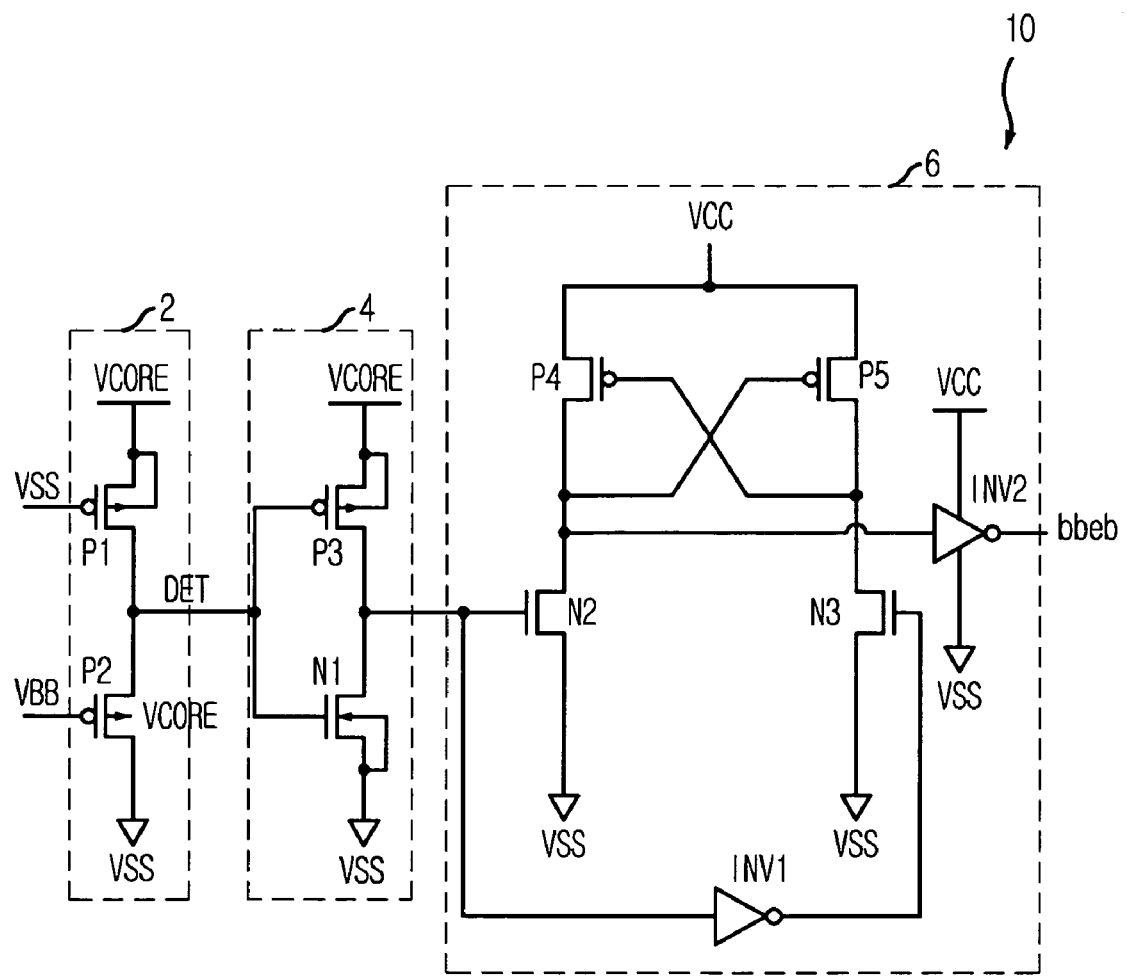
FIG. 2 is a circuit diagram illustrating the VBB level detector in the conventional circuit of FIG. 1.

Herein, the constitutions of the CMOS inverter 110 and the level shifter 120 are identical to those described in the conventional one, which is shown in FIG. 2. In the present invention, descriptions are focused on the voltage divider 100 because a circuit design for the voltage divider 100 is modified to overcome the problem of the prior art.

The voltage divider 100 is provided with a PMOS resistor P11 acting as a resistor (hereinafter, referred to as PMOS resistor) of which a source and a drain are connected to a core voltage VCORE and the detection voltage DET respectively where a ground voltage VSS is supplied to a gate thereof, and a NMOS resistor N11 acting as a resistor (hereinafter, referred to as NMOS resistor) of which a source and a drain are connected to a bulk bias voltage VBB and the detection voltage DET respectively where the core voltage VCORE is supplied to a gate thereof. Herein, the core voltage VCORE is supplied as a bulk bias voltage of the PMOS resistor P11.

Hereinafter, an operational mechanism of the VBB level detector shown in FIG. 3, will be set forth more fully.

To begin with, the level of the detection voltage DET is determined by a difference between effective resistances of the PMOS resistor P11 and the NMOS resistor N11. For instance, if the level of the fed back bulk bias voltage VBB becomes higher than a target level, i.e., if an absolute value of the VBB level becomes lowered, the effective resistance of the NMOS resistor N11 becomes increased. Accordingly, the detection voltage DET has a predetermined level higher than a switching point, e.g., VCORE/2 in general, of the CMOS inverter 110 so that the output signal of the CMOS inverter 110 becomes in logic low level.

Meanwhile, provided that the output signal of the CMOS inverter 110 becomes in logic low level, the output node of the level shifter 120 becomes in logic high level to activate the oscillation enable signal bbeb to be in logic low level at last.

In case that the oscillation enable signal bbeb is activated, a ring oscillator (not shown) is enabled so as to output the oscillation signal having a predetermined period. As a result, a doubler charge pump (not shown) performs a charge pumping operation under being controlled by a pump control logic (not shown) so as to lower the VBB level. That is, the absolute value of the VBB level becomes increased.

Meanwhile, if the VBB level is getting lowered to reach to the target level, the effective resistance of the NMOS resistor N11 becomes decreased so that the level of the detection voltage DET becomes lowered. Accordingly, the output signal of the CMOS inverter 110 becomes in logic high level and inactivates the oscillation enable signal to be in logic high level, to thereby stop the charge pumping operation.

As described above, the operation of the VBB level detector in accordance with the present invention is similar to the prior art one shown in FIG. 2. However, in comparison with the prior art, the inventive VBB level detector shows that the absolute value of the VBB detection level is proportional to the temperature variance, whereas the absolute value of the VBB detection level is almost uniform regardless of the temperature variance or is inversely proportional to the temperature variance in the prior art.

Figure 4:
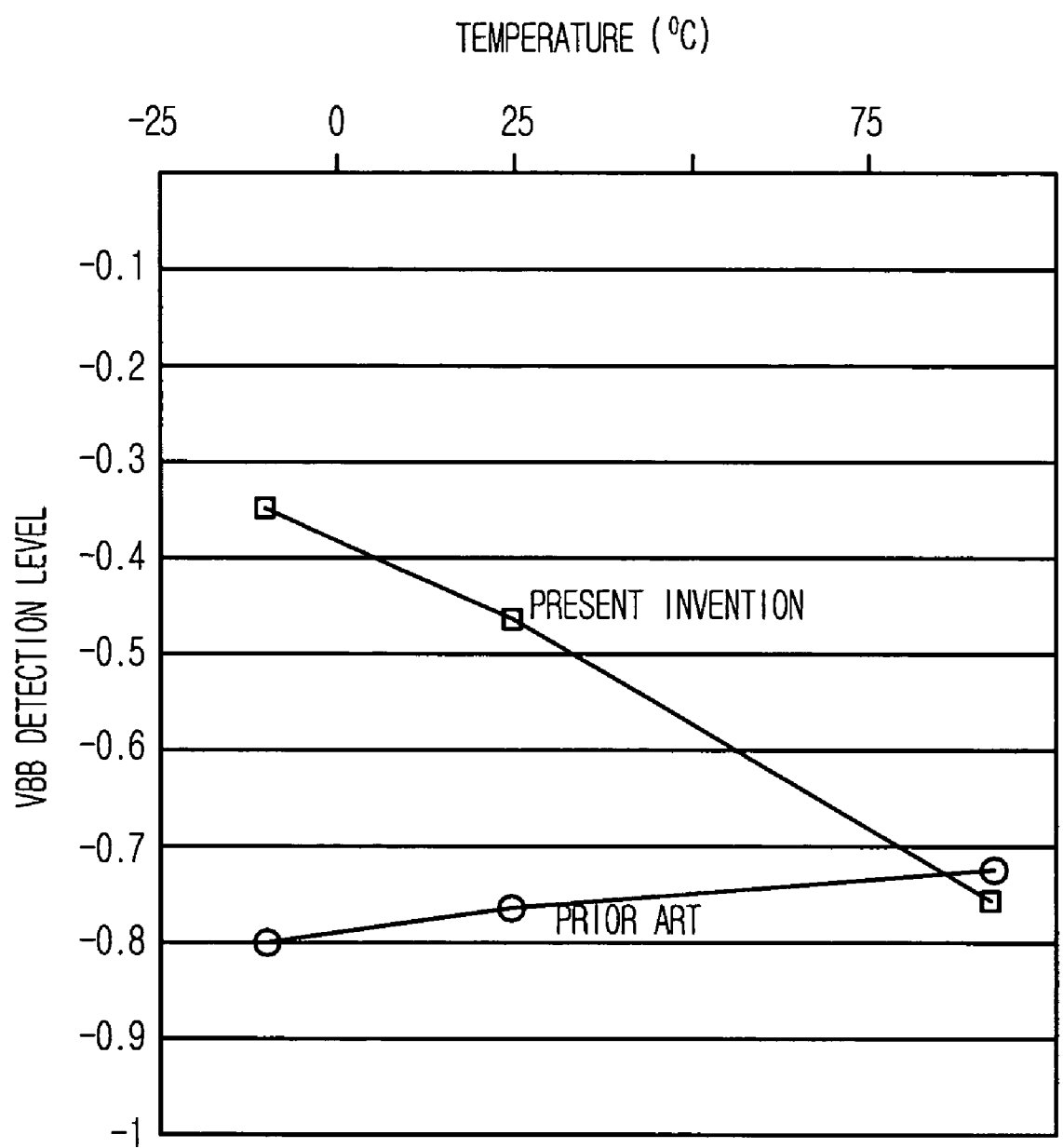
FIG. 4 is a graph showing a bulk bias voltage VBB level variance versus a temperature variance measured in each of the VBB level detectors of the prior art and the present invention.

FIG. 4 is a graph illustrating a VBB level variance versus a temperature variance measured in each of the VBB level detectors of the prior art and the present invention, respectively. Herein, three points in FIG. 4 are data measured at a temperature of −10° C., 25° C. and 90° C., respectively. In addition, a symbol of a white square denotes the data obtained according to the present invention and a symbol of a white circle denotes the data obtained according to the prior art.

Referring to FIG. 4, it is well understood that the VBB level detector of the present invention depends on the temperature variance. That is, as the temperature decreases, the absolute value of the VBB detection level becomes decreased, i.e., the VBB level rises up. On the contrary, as the temperature increases, the absolute value of the VBB detection level becomes increased, i.e., the VBB level becomes lowered.

In accordance with the embodiment of the present invention, since a voltage Vgs between the source and a bulk in the PMOS resistor P11 and a voltage Vgs between the source and a bulk in the NMOS resistor N11 are equally 0 V, the effective resistances of the transistors P11 and N11 in the operational range are varied with the voltage Vgs between the gate and the source and their sizes. Furthermore, because a switching operation of the CMOS inverter 110 is performed at a predetermined range that the level of the detection voltage DET is about VORE/2, it is possible to reduce the absolute value of the VBB detection level as the temperature decreases under the condition that the switching operation is rapidly performed according to the decrease of the temperature.

It is possible for the VBB level detector to satisfy the above condition by configuring a resistance divider having a temperature property opposite to the operational mode of the prior art. In order to embody the present invention, there is employed the NMOS resistor N11 instead of using the resistor PMOS transistor P2, of which the effective resistance variance versus temperature is less than that of the PMOS transistor P1, while the resistor PMOS transistor P1 is still in use.

Herein, a constant bias voltage is supplied to the PMOS resistor P11 so as to act as a constant resistor. Whereas, the NMOS resistor N11 serves as a variable resistor because the voltage difference Vgs between the gate and the source are varied according to the level of the bulk bias voltage VBB. That is, in case that the temperature is not varied, the level of the detection voltage DET is determined only by the absolute value of the bulk bias voltage VBB which is supplied to the source and the bulk in the NMOS resistor N11. Since a variance ratio of the effective resistance is changed as the temperature is varied, the level of the detection voltage DET is changed in spite of the same VBB level. That is, since the decrement ratio of the effective resistance of the NMOS resistor N11 is smaller than that of the PMOS resistor P11, the absolute value of the bulk bias voltage VBB should be increased more and more so as to stop the charge pumping operation in the long run. For instance, it is understood that the level of the detection voltage DET is increased as the temperature increases provided that the absolute value of the bulk bias voltage VBB is fixed to a predetermined voltage. Vice versa, the absolute value of the bulk bias voltage VBB should be increased to stop the charge pumping operation as the temperature increases.

As described above, in case of employing the VBB level detector in accordance with the present invention, the absolute value of the bulk bias voltage VBB is decreased as the temperature decreases so that it brings an effect for increasing the VBB level at a low temperature. In other words, the absolute value of the VBB becomes decreased at the low temperature in this case. Therefore, it is possible to attenuate the increase of the threshold voltage of the cell transistor at the low temperature so as to prevent a time to write recovery (tWR) fail.

Figure 5:
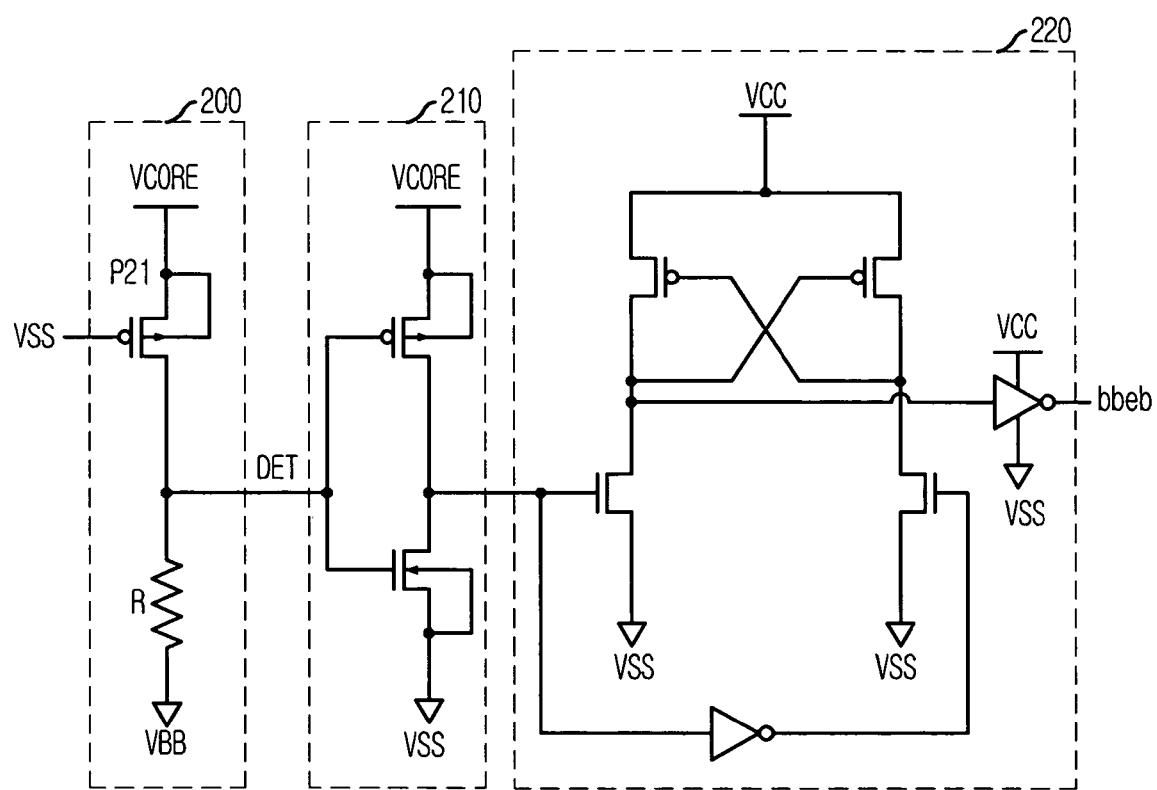
FIG. 5 is a circuit diagram of a VBB level detector in accordance with another embodiment of the present invention.

FIG. 5 is a circuit diagram of a VBB level detector in accordance with another embodiment of the present invention.

Referring to FIG. 5, the VBB level detector includes a voltage divider 200, a CMOS inverter 210, and a level shifter 220, as similar to the VBB level detector in the embodiment described already. The constitutions of the CMOS inverter 210 and the level shifter 220 are identical to those in the prior art shown in FIG. 2, and a circuit design of the voltage divider 200 is modified in another embodiment of the present invention.

The voltage divider 200 is provided with a resistor PMOS resistor P21 of which a source and a drain are connected to a core voltage VCORE and the detection voltage DET respectively where a ground voltage VSS is supplied to a gate thereof, and a resistor R connected to a detection voltage DET and the bulk bias voltage VBB. In comparison with the embodiment illustrated above, the resistor NMOS resistor N11 in FIG. 3 is replaced by the resistor R.

The resistor R has almost similar property to the resistor NMOS resistor N11 in viewpoint of the temperature variance. The resistor R may be configured as an active region on a substrate or a polysilicon.

The present application contains subject matter related to Korean patent application No. 2004-58450, filed in the Korean Intellectual Property Office on Jun. 30, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

For instance, although it is illustrated in the above embodiment that the signal is outputted by connecting the level shifter to a rear end of the CMOS inverter 110 and 120, the level shifter merely plays a role in controlling the swing width so that it is not regarded as an essential element for the present invention.

In addition, while the core voltage is used in the above embodiment for representative illustration among various internal power voltages, the other internal power voltages instead of the core voltage may be used in the present invention.

In accordance with the present invention, it is possible to secure a margin for the tWR fail at the low temperature, and further improve testability, to thereby expect an amazing effect for reducing expense and time for the test.

What is claimed is:

1. A bulk bias voltage level detector in a semiconductor memory device, comprising:
a voltage divider configured to generate a detection voltage based on an inputted bulk voltage; and
a CMOS circuit configured to generate an output signal having a predetermined logic value determined by the detection voltage,
wherein the voltage divider includes a transistor having a gate directly connected to a ground voltage and a passive resistor directly connected to the inputted bulk voltage, and outputs the detection voltage from a node between the transistor and the passive resistor, wherein said transistor and said passive resistor are connected in series.

2. The bulk bias voltage level detector recited in claim 1, further comprising a level shifter for increasing a swing width of the output signal of the CMOS circuit.

3. The bulk bias voltage level detector recited in claim 2, wherein an internal power voltage of the semiconductor memory device is a core voltage.

4. The bulk bias voltage level detector recited in claim 3, wherein the level shifter converts the output signal of which the swing width ranges from the ground voltage to the core voltage, into a signal of which a swing width ranges from the ground voltage to an external power voltage.

\* \* \* \* \*